United States Patent
Gagne et al.

(10) Patent No.: US 8,330,523 B2
(45) Date of Patent: Dec. 11, 2012

(54) STABLE ON-RESISTANCE SWITCH CIRCUIT

(75) Inventors: Nickole Gagne, Saco, ME (US); Julie Lynn Stultz, Scarborough, ME (US); Steven Macaluso, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 57 days.

(21) Appl. No.: 12/953,162

(22) Filed: Nov. 23, 2010

(65) Prior Publication Data

US 2012/0126878 A1    May 24, 2012

(51) Int. Cl.
  *H03K 17/14*    (2006.01)
(52) U.S. Cl. ....................................... 327/378
(58) Field of Classification Search .......... None
  See application file for complete search history.

(56) References Cited

U.S. PATENT DOCUMENTS

| | | | |
|---|---|---|---|
| 4,093,874 A | | 6/1978 | Pollitt |
| 5,953,640 A | * | 9/1999 | Meador et al. ............... 455/73 |
| 6,791,296 B1 | * | 9/2004 | Chu et al. ..................... 320/114 |
| 7,692,476 B2 | * | 4/2010 | Anzai ............................ 327/513 |
| 8,012,821 B2 | * | 9/2011 | Ryou et al. ................... 438/210 |
| 8,149,047 B2 | * | 4/2012 | Tsai et al. ..................... 327/539 |

FOREIGN PATENT DOCUMENTS

CN   102480282 A   5/2012

OTHER PUBLICATIONS

"Chinese Application Serial No. 201120497441.9, Office Action mailed Apr. 24, 2012", 1 pg.
"Chinese Application Serial No. 201120497441.9, Response filed Jul. 3, 2012 to Office Action mailed Apr. 24, 2012", 24 pgs.

* cited by examiner

*Primary Examiner* — Lincoln Donovan
*Assistant Examiner* — Sibin Chen
(74) *Attorney, Agent, or Firm* — Schwegman, Lundberg & Woessner, P.A.

(57) ABSTRACT

This document discusses, among other things, a compensation circuit configured to modulate a control voltage of a switch over a range of ambient temperatures during a conduction state of the switch to maintain a specified resistance between first and second nodes of the switch. The compensation circuit can include a temperature-insensitive resistor configured to provide a sense current, a current mirror configured to provide a mirror current using the sense current, and a temperature-sensitive resistor configured to provide the control voltage using the mirror current.

20 Claims, 4 Drawing Sheets

STABLE ON-RESISTANCE SWITCH CIRCUIT

BACKGROUND

Electronic circuits and systems often include electronic switches. An electronic switch can be used to transmit an analog signal to a circuit path or to prevent an analog signal from being sent to a circuit path. Such a switch is sometimes referred to as an analog switch or a pass switch to differentiate this type of switch from a digital switch that changes its output state in response to an input, but does not pass a received signal. Switches are designed to respond to a nominal control voltage that enables an "on" state of the switch. The control voltage can determine an expected ON-resistance. However, physical properties of the switch and ambient conditions can cause the ON-resistance of the switch to deviate from the expected ON-resistance even when the control voltage is maintained at the nominal value. Deviation of the ON-resistance of the switch from the expected value can distort the signal as it passes through the switch. Factors that can contribute to the ON-resistance of the switch deviating from an expected value when a nominal control voltage is maintained at the switch include, but are not limited to, process variations between switches or temperature variation in a particular switch.

FIG. 1 illustrates generally relationships 100 between switch ON-resistance 110 (ohms) over a range of analog signal voltages 111 applied to a fast process-corner switch and a slow process-corner switch under different supply voltage and temperature conditions. Process-corner speed is related to the threshold voltage of a switch, such as a MOS transistor switch. A fast process-corner switch generally includes a lower threshold voltage than a slow process-corner switch. Various factors can contribute to threshold voltage variations in switches intended to be identical, including process variations.

The example of FIG. 1 illustrates generally, for the fast process-corner switch, plots 102, 105, 106, 108 and, for the slow process-corner switch, plots 101, 103, 104, 106. The vertical axis 110 indicates resistance (ohms) between the switched terminals of each switch, for example, the resistance between the drain and source of a switch including a MOS passgate. The horizontal axis 111 indicates the voltage applied to the switched terminals of the switch.

For the fast process-corner switch, plots 102, 106 are characterized by a device having a 3.0-volt supply voltage, and plots 105, 108 are characterized by a device having a 4.4-volt supply voltage. Plots 106, 108 are characterized by a device subjected to a temperature of about −40 degrees Celsius, and plots 102, 105 are characterized by a device subjected to a temperature of about 80 degrees Celsius.

Similarly, for the slow process-corner switch, plots 101, 103 are characterized by a device having a 3.0-volt supply voltage, and plots 104, 107 are characterized by a device having a 4.4-volt supply voltage. Plots 103, 107 are characterized by a device subjected to a temperature of about −40 degrees Celsius, and plots 101, 104 are characterized by a device subjected to a temperature of 80 degrees Celsius.

The ON-resistance of the various measurement conditions ranges over about 9.7 ohms when the applied signal voltage is 0.4 volts, at 112, and over about 10.3 ohms when the switched voltage is about 0.5 volts, at 113. For some applications and signal protocols, such a range of ON-resistance may result in performance discrepancies of a particular switch, or for switches with processing variations, that are not acceptable.

OVERVIEW

This document relates generally to apparatus and methods to modulate a switch control voltage to compensate for process variations, temperature variations, or process and temperature variations that can affect the ON-resistance of a switch. In an example, a compensation circuit can be configured to modulate a control voltage of a switch over a range of ambient temperatures during a conduction state of the switch to maintain a specified resistance between first and second nodes of the switch. The compensation circuit can include a temperature-insensitive resistor configured to provide a sense current, a current mirror configured to provide a mirror current using the sense current, and a temperature-sensitive resistor configured to provide the control voltage using the minor current. In an example, the specified resistance can include a specified range of resistance, such as illustrated in FIG. 4, etc. In an example, the specified range of resistance can be programmed, specified at the time of design using one or more internal components, specified using one or more external components, specified using a feedback signal, etc.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document relates generally to apparatus and methods to modulate a switch control voltage to compensate for process and temperature variation that can affect the ON-resistance of a switch. As semiconductor devices become smaller, devices that are intended to be interchangeable can include performance differences due to various factors, such as process variations. In some instances, performance differences due to process variation can be observed between devices fabricated on the same wafer. In other examples, ON-resistance of a switch can also be affected by temperature. For example, for a MOS transistor switch, the ON-resistance between the source and drain can vary even though the control voltage at the gate of the transistor is stable.

Figure 2:
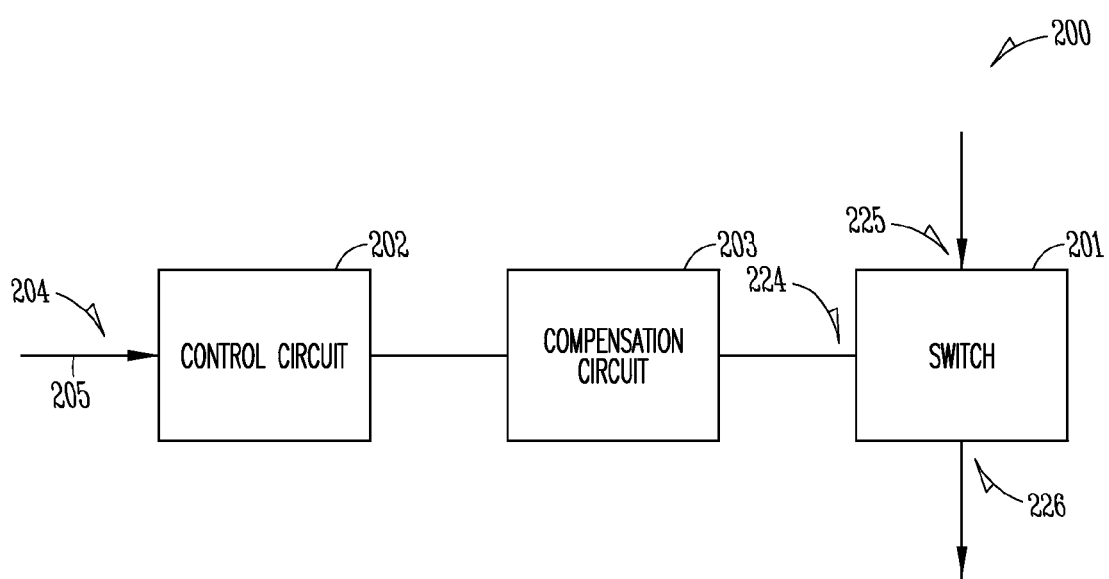
FIG. 2 illustrates generally block diagram for an example control circuit.

FIG. 2 illustrates generally an example of a circuit 200 including a control circuit 202 configured to modulate a control voltage of a switch such that the switch can maintain a stable ON-resistance, such as a specified resistance or range of resistances between first and second terminals of the switch over a range of temperatures as well as for a plurality of switches differing from each other primarily due to processing variations, such as threshold voltage variation. The circuit 200 includes a switch 201, a control circuit 202, and a compensation circuit 203. The control circuit 202 can include start-up logic for initiating a state change of the switch from an "off", high impedance state, to a "on", low impedance state, or a conduction state, and for initiating the compensation circuit 203 as the state changes from the "off" state to the "on' state. The control circuit 202 includes an input 204 for receiving a control signal 205. The control circuit 202 changes the state of the switch 201 in response to the received control signal 205. In an example, the compensation circuit 203 can stabilize the ON-resistance of the switch 201 by modulating the control voltage applied to the switch. In an example, the compensation circuit 203 can stabilize the ON-resistance of the switch 201 in accordance with other switches that differ from the switch primarily in respect to processing variations, such as other switches made at the same time or other semiconductor switches made on the same semiconductor wafer as the switch 201. In an example, the compensation circuit 203 can stabilize the ON-resistance of the switch 201 over a range of temperatures. In certain examples, the compensation circuit 203 can stabilize the ON-resistance of the switch 201 in accordance with other switches that differ from the switch 201 primarily in respect to processing variations, and the compensation circuit 203 can stabilize the ON-resistance of the switch 201 over a range of temperatures. The switch 201 can include a control node 224 and switched terminals 225, 226. In certain examples, the switch 201 can be an audio switch. In an example, the switch 201 can include a data switch, such as an audio data switch, video data switch, or a Universal Serial Bus (USB) switch.

Figure 3:
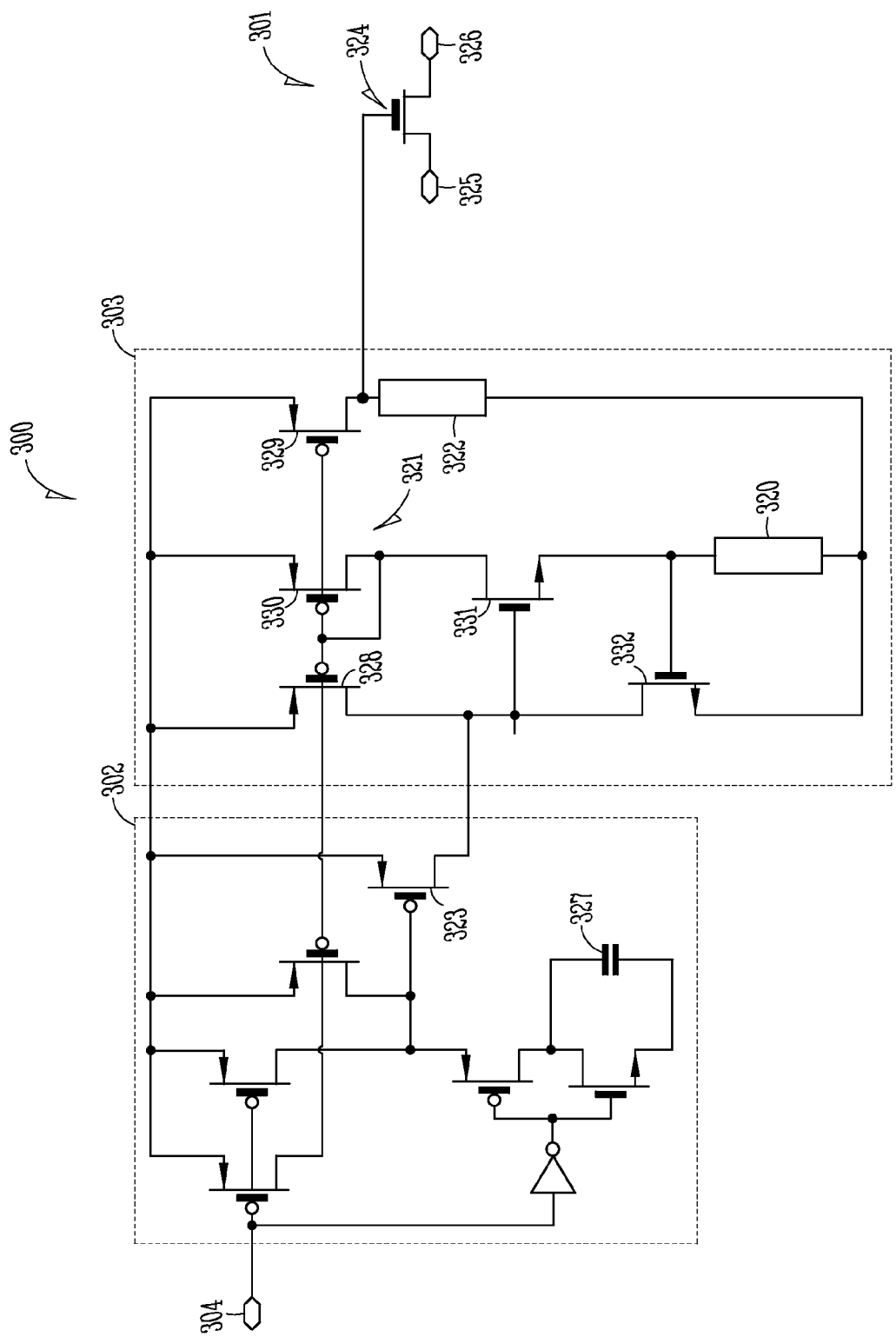
FIG. 3 illustrates generally an example of a switch circuit including a compensation circuit.

FIG. 3 illustrates generally an example of a switch circuit 300 including a switch 301, a control circuit 301, and a compensation circuit 303. In an example, the switch 301 can include a MOS transistor, sometimes referred to as a passgate. In an example, the compensation circuit 303 can include a temperature-insensitive resistance 320, a current mirror 321, and a temperature-sensitive resistance 322. In an example, the switch circuit 300 can be included in an integrated circuit, such as a die. In an example, the switch 301 can have two states, a first high impedance state and a second low-impedance state. The control circuit 302 can include an input 304 for receiving a signal to select the state of the switch 301, such as an enable signal.

In an example, the control circuit 302 can be responsive to the received signal and select either the first state or the second state of the switch. For example, upon receiving a signal to change the switch 301 from the first high impedance state to the second low impedance state, the control circuit 302 can turn on an injection transistor 323 to inject a current into the compensation circuit 303. In an example, the injection transistor 323 can be turned on for a predetermined interval after the signal to change the switch from the first high impedance state to the second low impedance state is received. The injected current, as discussed below, can enable the current mirror 321 in the compensation circuit 303, causing a control voltage to be applied to a control node 324 of the switch 301. In an example, a low logic signal received at the input 304 of the control circuit 302 can turn off the injection transistor 323, as well as the current mirror 321, of the compensation circuit 303. A temperature-sensitive resistance 322 of the compensation circuit 303 can be coupled to the control node 324 of the switch 301. The temperature-sensitive resistance 322 can pull the voltage at the control node 324 to a low reference causing the switch 301 to change to the second high impedance state, the high impedance referenced between first and second terminals 325, 326 of the switch 301. In the illustrated example of FIG. 3, a high logic signal received at the input 304 of the control circuit 302 can turn on the injection transistor 323 to inject a current into the compensation circuit. It is understood that other control circuits are possible that inject a current in to the compensation circuit 303 in response to a high signal received at the input 304 of the control circuit 302 without departing from the scope of the present subject matter. In an example, the control circuit 302 can include a capacitor 327 to limit the time interval the injection transistor 323 is turned on after the signal to change the switch 301 from the first high impedance state to the second low impedance state is received.

The compensation circuit 303 can include a temperature-insensitive resistance 320, a current mirror 321 and a temperature-sensitive resistance 322 configured to provide a modulated control voltage that can maintain a stable switch ON-resistance, such as a specified resistance or range of resistances, between first and second terminals 325, 326 of the switch 301. The current mirror 321 can include first and second mirror transistors 328, 329 and a sense transistor 330. When the first and second mirror transistors 328, 329 and the sense transistor 330 are "on", current flowing through the sense transistor 330 can be mirrored through the first and second mirror transistors 328, 329. In an example, the sense transistor 330 can be coupled in series with a temperature-insensitive resistance 320. A bootstrap circuit of the compensation circuit 303 can include a first regulating transistor 331 and a second regulating transistor 332. The bootstrap circuit is a reference circuit that can be used in the compensation circuit to produce a voltage reference that is based on a threshold voltage. The threshold voltage-based reference voltage can setup a sense current in the compensation circuit 303. For example, the first regulating transistor 331 can be coupled between the sense transistor 330 and the temperature-insensitive resistance 320, and the second regulating transistor 332 can be coupled in series with the first mirror transistor 328. In an example, control inputs of the first and second regulating transistors 331, 332 can be cross-coupled. The bootstrap circuit, including the first and second regulating transistors 331, 332, can maintain a reference voltage across the temperature-insensitive resistance 320 that is dependent on the threshold voltage of the second regulating transistor 332 In turn, the threshold-based reference voltage across the temperature-insensitive resistance 320 can provide a reference current through the temperature-insensitive resistance 320 that is also dependent on the threshold voltage of the second regulating transistor 332. In certain examples, an injection transistor 323 of the control circuit 302 can inject a current into the bootstrap circuit to initiate the threshold voltage-based reference voltage maintained by the first and second regulating transistors 331, 332.

In an example, the threshold voltage-based reference current, maintained through the temperature insensitive resistance 320 by the first and second regulating transistors 331, 332, can be mirrored through the second mirror transistor 329. The temperature-sensitive resistance 322 coupled in series with the second mirror transistor 329 can provide a control voltage to the switch 301. In an example, the temperature-sensitive resistance 322 changes resistance over a range of temperature. As the resistance changes with temperature, the control voltage at the switch 301 can also change as the current through the temperature-sensitive resistance 322 remains substantially stable due to the threshold voltage-based reference voltage across the temperature insensitive resistance 320. The change in control voltage at the switch 301 can compensate for the change in switch ON-resistance over the range of temperatures. In certain examples, the temperature-insensitive resistance 320 can include a poly-silicon resistor, such as a P+ poly-silicon resistor. Such resistors can have an absolute temperature coefficient of 150 ppm/° C. or less. In some examples, the temperature-sensitive resistance 322 can include a diffusion resistor, or one or more other types of resistors.

In certain examples, the compensation circuit 303 can compensate for processing variations between individual switch circuits such that the circuits provide predictable, stable and substantially the same ON-resistance under similar conditions. Processing variation compensation can be provided where a sense voltage across the temperature insensitive resistance 320 depends on the threshold voltage of the second regulating transistor 332. Threshold voltage variations can provide an indication of processing variations between circuit components including, but not limited to, processing variations between components within an area of a wafer, processing variations between components at opposite extremes of a wafer, and processing variations between components formed on different wafers. Thus, a compensation circuit according to the present subject matter can provide switches having stable, predictable and substantially the same ON-resistance for similar conditions even though the switches have different threshold voltages resulting from processing variations. In certain examples, a compensation circuit can compensate for both processing variation between switch circuits and temperature variation of a particular switch circuit.

In certain examples, temperature can also affect the threshold voltage of devices use in the switch circuit. The regulating transistors 331, 332 can automatically compensate for temperature induced shifts of the threshold voltage by adjusting the threshold voltage-based reference voltage. In turn, the sense current value can adjust and the current through the temperature sensitive resistors can adjust. Thus, the compensation circuit can adjust the control voltage of the switch using temperature effects of threshold voltage and temperature effects of temperature sensitive resistance. In certain examples, the compensation circuit can use both of these effects to maintain a stable ON-resistance of a switch over a range of temperatures.

Figure 1:
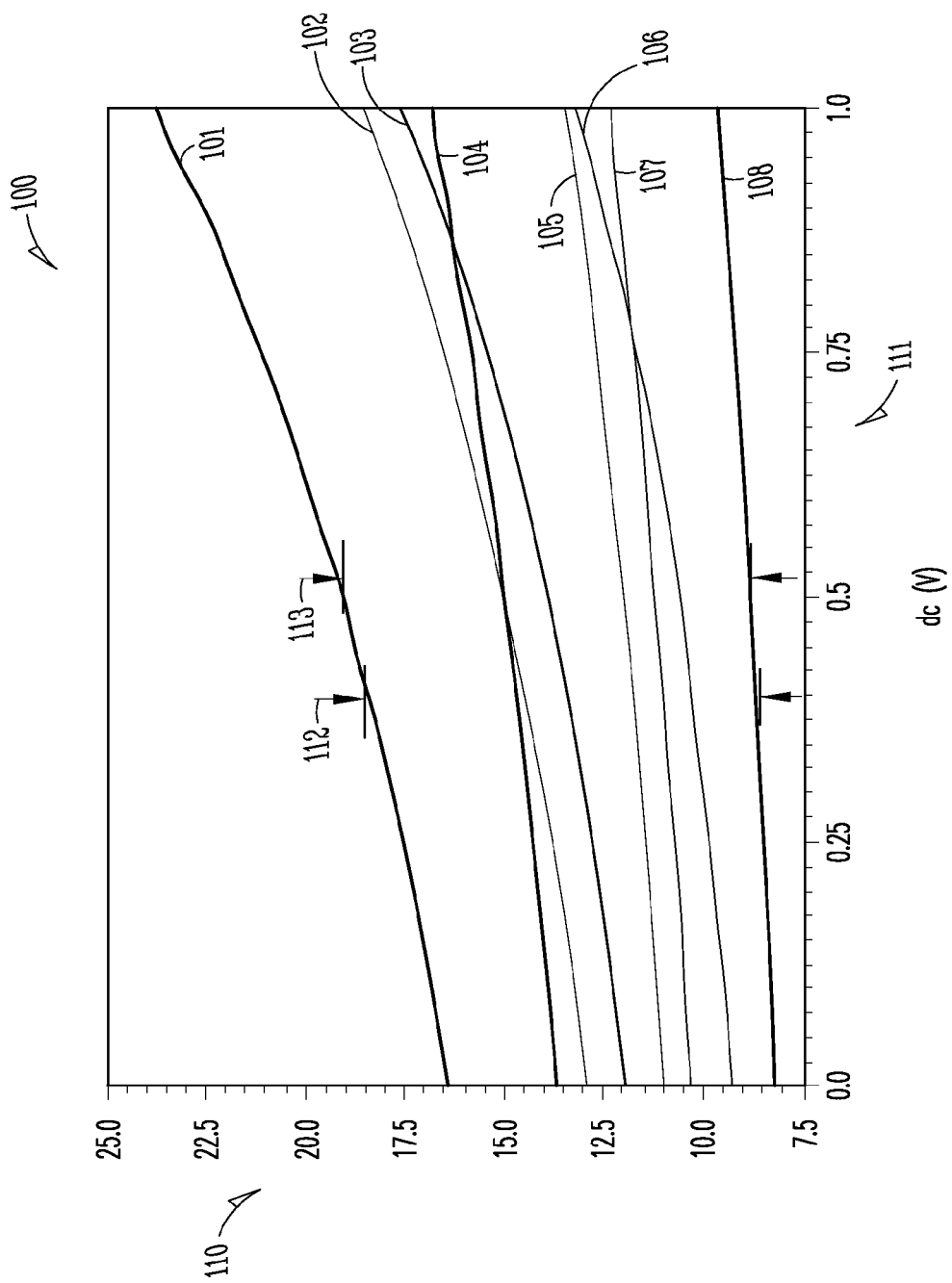
FIG. 1 illustrates generally relationships between switch ON-resistance over a range of analog signal voltages applied to the switch.

For example, referring to FIG. 1 and plots 105, 108, illustrating ON-resistance for a fast process-corner switch with 4.4-volt supply voltage at temperatures of −40 degree Celsius and 80 degree Celsius, respectively, one can observe that the ON-resistance of the device drops as the temperature drops. In an example, the compensation circuit 303 can use the constant current generated in part by the temperature-insensitive resistance 320 to drive the temperature-sensitive resistance 322 such that as the temperature of the switch circuit 300, including the switch 301, drops, resistance of the temperature-sensitive resistance 322 can also drop and lower the control voltage to the switch 301. The plots of FIG. 1 show that for a device having the same process-corner and gate voltage, the ON-resistance of the device can tend to drop as it is exposed to cooler temperatures. Combining the tendencies of the switch 301 ON-resistance to fall with temperature and the compensation circuit 303 to lower the control voltage as the temperature falls, the compensation circuit 303 can maintain a stable ON-resistance, such as a specified resistance or range of resistances, of the switch 301 over a range of temperatures. For example, the compensation circuit 303 can drive the switch 301 softer (e.g. lower control voltage) as the temperature falls and can drive the switch 301 harder (e.g. higher control voltage) as the temperature rises.

In certain examples, the switch circuit 300 can be fabricated on an integrated circuit die using components in close proximity to one another on the integrated circuit die. Such a construction can reduce the variation of ON-resistance between devices as the chemical and physical process variations that can exist are compensated by the same characteristics being present in the components of the compensation circuit 303, such as the temperature-insensitive resistance 320, the current mirror 321, and the temperature-sensitive resistance 322.

Figure 4:
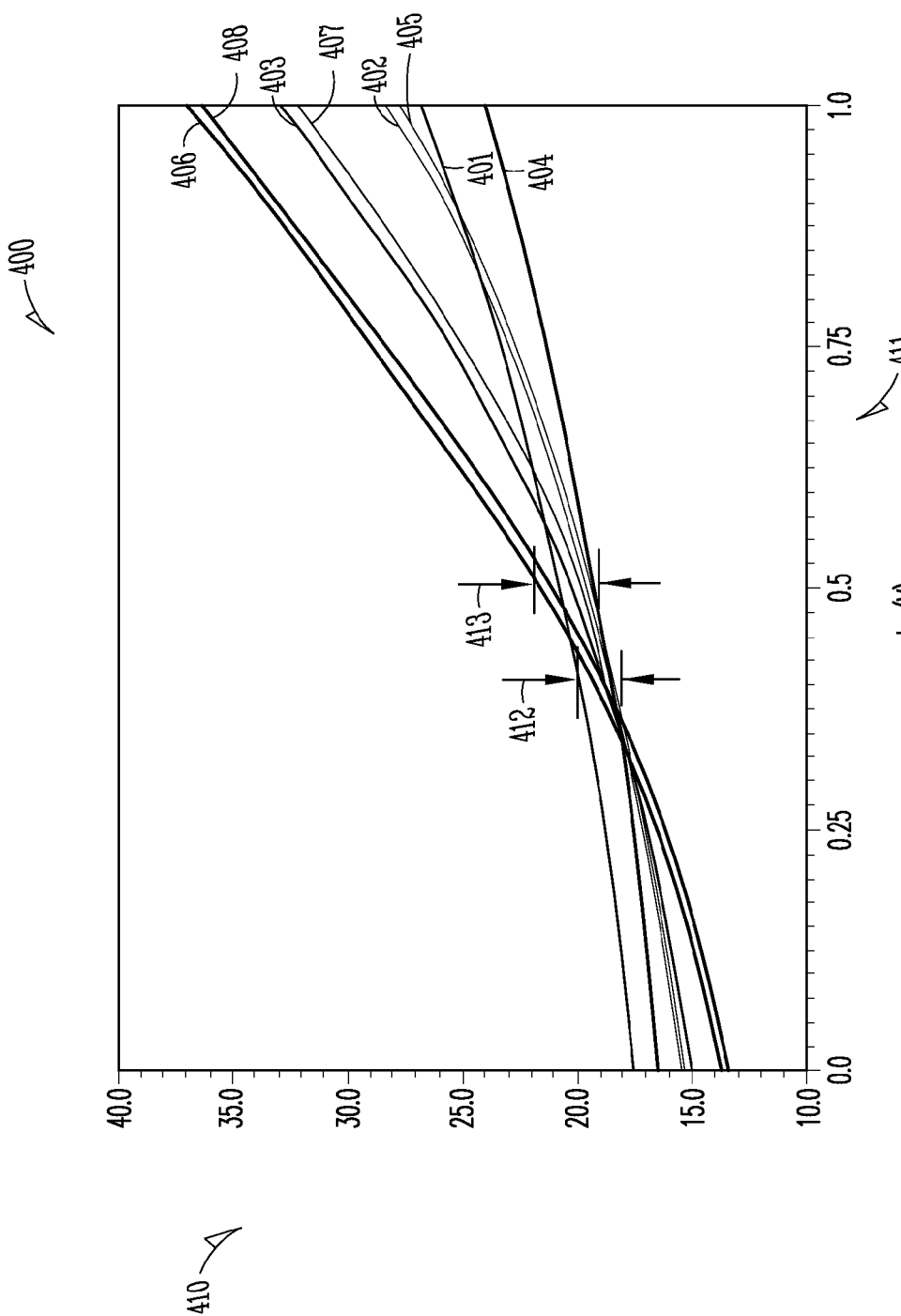
FIG. 4 illustrates generally relationships between ON-resistance over a range of analog signal voltages applied to a switch circuit having a compensation circuit.

FIG. 4 illustrates generally relationships 400 between ON-resistance 410 (ohms) over a range of analog signal voltages 411 applied to a fast process-corner switch and a slow process-corner switch under different supply voltage and temperature conditions using a compensation circuit, such as described herein. The relationships 400 include plots 402, 405, 406, 408 for the fast process-corner switch circuit and plots 401, 403, 404, 407 for the slow process-corner switch circuit. The vertical axis 410 indicates resistance (ohms) between the switched terminals of each switch circuit, for example the ON-resistance between the drain and source of a switch circuit including a MOS passgate. The horizontal axis 411 indicates the voltage applied to the switched terminals of the switch circuit.

For the fast process-corner switch circuit, plots 402, 406 are characterized by a device having a 3.0-volt supply voltage, and plots 405, 408 are characterized by a device having a 4.4-volt supply voltage. Plots 406, 408 are characterized by a device subjected to a temperature of about −40 degrees Celsius, and plots 402, 405 are characterized by a device subjected to a temperature of 80 degrees Celsius.

Similarly, for the slow process-corner switch circuit, plots 401, 403 are characterized by a device having a 3.0-volt supply voltage, and plots 404, 407 are characterized by a device having a 4.4-volt supply voltage. Plots 403, 407 are characterized by a device subjected to a temperature of about −40 degrees Celsius, and plots 401, 404 are characterized by a device subjected to a temperature of 80 degrees Celsius.

A device, such as an analog switch, using a compensation circuit as discussed above can provide a more stable ON-resistance with respect to temperature and processing variations. For example, considering the devices and temperatures illustrated in FIG. 4, at about 0.4 volts across the switch terminals, the ON-resistance of the device is stable within a range, at 412, of about 1.5 ohms. At 0.5 volts across the switched terminals, the ON-resistance of the device is stable within a range, at 413, of about 2.5 ohms. Comparing these results to those of FIG. 1, the compensation circuit described herein significantly stabilizes the ON-resistance of the switch circuits over a wide temperature range, as well as over process variations, resulting in devices having different process-corners.

ADDITIONAL NOTES

In Example 1, an apparatus can include a switch, including a control node configured to receive a control voltage, and a compensation circuit configured to modulate the control voltage over a range of ambient temperatures during a conduction state of the switch to maintain a specified resistance between first and second nodes of the switch. The compensation circuit can include a temperature-insensitive resistor configured to provide a sense current, a regulating transistor configured to maintain a sense voltage across the temperature insensitive resistor to provide the sense current, wherein the sense voltage is based on a threshold voltage of the first regulating transistor, a current mirror configured to provide a mirror current using the sense current, and a temperature-sensitive resistor configured to provide the control voltage using the mirror current.

In Example 2, the temperature-insensitive resistor of Example 1 optionally includes a poly-silicon resistor.

In Example 3, the poly-silicon resistor of any one or more of Examples 1 and 2 optionally includes a P+ poly-silicon resistor.

In Example 4, the temperature-sensitive resistor of any one or more of Examples 1 through 3 optionally includes a diffusion resistor.

In Example 5, the switch of any one or more of Examples 1 through 4 optionally includes a temperature-sensitive switch.

In Example 6, the temperature-sensitive switch of any one or more of Examples 1 through 5 optionally includes a transmission gate.

In Example 7, the temperature-sensitive switch of any one or more of Examples 1 through 6 optionally includes a NMOS transmission gate.

In Example 8, the apparatus of any one or more of Examples 1 through 6 optionally a control circuit configured to receive a control signal and to couple the temperature-insensitive resistor to a voltage source during a first state of the control signal, wherein the conduction state of the switch corresponds to the first state of the control signal.

In Example 9 the control circuit of any one or more of Examples 1 through 8 is optionally configured to decouple the temperature-insensitive resistor from the voltage source during a second state of the control signal.

In Example 10, the apparatus of any one or more of Examples 1 through 9 optionally includes an integrated circuit including the compensation circuit.

In Example 11, the integrated circuit of any one or more of Examples 1 through 10 optionally includes the switch.

In Example 12, the integrated circuit of any one or more of Examples 1 through 11 optionally includes a data switch.

In Example 13, the integrated circuit of any one or more of Examples 1 through 12 optionally includes a Universal Serial Bus (USB) switch.

In Example 14, the integrated circuit of any one or more of Examples 1 through 13 optionally includes an audio switch.

In Example 15, a method can include receiving a control voltage at a control node of a switch, and modulating the control voltage over a range of ambient temperatures during a conduction state of the switch to maintain a specified resistance between first and second nodes of the switch. The modulating the control voltage can include generating a sense voltage using a threshold voltage of a regulating transistor, providing the sense voltage across a temperature insensitive resistor to generate a sense current, providing a mirror current using the sense current and a current mirror, and providing the control voltage using the mirror current and a temperature-sensitive resistor.

In Example 16, the providing the sense current of any one or more of Examples 1 through 15 optionally includes using a poly-silicon resistor.

In Example 17, the using the poly-silicon resistor of any one or more of Examples 1 through 16 optionally includes using a P+ poly-silicon resistor.

In Example 18, the providing the control voltage using the temperature-sensitive resistor of any one or more of Examples 1 through 17 optionally includes using a diffusion resistor.

In Example 19, the providing the sense voltage of any one or more of Examples 1 through 18 optionally includes receiving a control signal at a control circuit coupled to the temperature-insensitive resistor, and injecting a start-up current into the regulating transistor.

In Example 20, a system can include a switch including an NMOS transmission gate. The switch can include a control node configured to receive a control voltage. The system can also include a compensation circuit configured to modulate the control voltage over a range of ambient temperatures during a conduction state of the switch to maintain a specified resistance between first and second nodes of the switch. The compensation circuit can include a P+ poly-silicon resistor configured to provide a sense current, a regulating transistor configured to maintain a sense voltage across the temperature insensitive resistor to provide the sense current, wherein the sense voltage is based on a threshold voltage of the first regulating transistor, a current mirror configured to provide a mirror current using the sense current, a diffusion resistor configured to provide the control voltage using the mirror current. The system can also include a control circuit configured to receive a control signal and to couple the temperature-insensitive resistor to a voltage source during a first state of the control signal, wherein the conduction state of the switch corresponds to the first state of the control signal.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
a switch including a control node configured to receive a control voltage; and
a compensation circuit configured to modulate the control voltage over a range of ambient temperatures during a conduction state of the switch to maintain a specified resistance between first and second nodes of the switch, the compensation circuit including:
a temperature-insensitive resistor configured to provide a sense current;
a regulating transistor configured to maintain a sense voltage across the temperature insensitive resistor to provide the sense current, wherein the sense voltage is based on a threshold voltage of the regulating transistor;
a current mirror configured to provide a mirror current using the sense current; and
a temperature-sensitive resistor configured to provide the control voltage using the mirror current.

2. The apparatus of claim 1, wherein the temperature-insensitive resistor includes a poly-silicon resistor.

3. The apparatus of claim 2, wherein the poly-silicon resistor includes a P+ poly-silicon resistor.

4. The apparatus of claim 1, wherein the temperature-sensitive resistor includes a diffusion resistor.

5. The apparatus of claim 1, wherein the switch includes a temperature-sensitive switch.

6. The apparatus of claim 5, wherein the temperature-sensitive switch includes a transmission gate.

7. The apparatus of claim 5, wherein the temperature-sensitive switch includes a NMOS transmission gate.

8. The apparatus of claim 1, including a control circuit configured to receive a control signal and to couple the temperature-insensitive resistor to a voltage source during a first state of the control signal, wherein the conduction state of the switch corresponds to the first state of the control signal.

9. The apparatus of claim 8, wherein the control circuit is configured to decouple the temperature-insensitive resistor from the voltage source during a second state of the control signal.

10. The apparatus of claim 1, including an integrated circuit including the compensation circuit.

11. The apparatus of claim 10, wherein the integrated circuit includes the switch.

12. The apparatus of claim 11, wherein the integrated circuit includes a data switch.

13. The apparatus of claim 11, wherein the integrated circuit includes a Universal Serial Bus (USB) switch.

14. The apparatus of claim 11, wherein the integrated circuit includes an audio switch.

15. A method comprising:
receiving a control voltage at a control node of a switch; and
modulating the control voltage over a range of ambient temperatures during a conduction state of the switch to maintain a specified resistance between first and second nodes of the switch, wherein the modulating includes:
generating a sense voltage using a threshold voltage of a regulating transistor;
providing the sense voltage across a temperature insensitive resistor to generate a sense current;
providing a mirror current using the sense current and a current mirror; and
providing the control voltage using the mirror current and a temperature-sensitive resistor.

16. The method of claim 15, wherein the providing the sense current includes using a poly-silicon resistor.

17. The method of claim 16, wherein the using the poly-silicon resistor includes using a P+ poly-silicon resistor.

18. The method of claim 15, wherein the providing the control voltage using the temperature-sensitive resistor includes using a diffusion resistor.

19. The method of claim 15, wherein the providing the sense voltage includes:
receiving a control signal at a control circuit coupled to the temperature-insensitive resistor; and
injecting a start-up current into the regulating transistor.

20. A system comprising:
a switch including an NMOS transmission gate, the switch including a control node configured to receive a control voltage;
a compensation circuit configured to modulate the control voltage over a range of ambient temperatures during a conduction state of the switch to maintain a specified resistance between first and second nodes of the switch, the compensation circuit including:
a P+ poly-silicon resistor configured to provide a sense current;
a regulating transistor configured to maintain a sense voltage across the temperature insensitive resistor to provide the sense current, wherein the sense voltage is based on a threshold voltage of the first regulating transistor;
a current mirror configured to provide a mirror current using the sense current; and
a diffusion resistor configured to provide the control voltage using the mirror current; and
a control circuit configured to receive a control signal and to couple the temperature-insensitive resistor to a voltage source during a first state of the control signal, wherein the conduction state of the switch corresponds to the first state of the control signal.

* * * * *